US008995801B2

(12) United States Patent
Doyle et al.

(10) Patent No.: US 8,995,801 B2
(45) Date of Patent: Mar. 31, 2015

(54) PLANAR COAXIAL ELECTRICALLY AND OPTICALLY CONDUCTIVE STRUCTURE

(71) Applicant: International Business Machines Corporation, Armonk, NY (US)

(72) Inventors: Matthew S. Doyle, Rochester, MN (US); Joseph Kuczynski, Rochester, MN (US); Kevin A. Splittstoesser, Stewartville, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/927,648

(22) Filed: Jun. 26, 2013

(65) Prior Publication Data
US 2015/0003776 A1    Jan. 1, 2015

(51) Int. Cl.
*G02B 6/12*      (2006.01)
*H05K 1/02*      (2006.01)
(Continued)

(52) U.S. Cl.
CPC ............. *H05K 1/0274* (2013.01); *G02B 6/122* (2013.01); *G02B 6/132* (2013.01)
USPC ............................................ 385/14; 385/101

(58) Field of Classification Search
CPC ............... G02B 6/29325; G02B 6/132; G02B 2006/121; G02B 6/4283; G02F 1/025; H01L 21/76229; H01L 21/76877; H01L 21/76224; H05K 3/107
USPC .................................... 385/14, 101, 129–132
See application file for complete search history.

(56) References Cited

U.S. PATENT DOCUMENTS 6,285,808 B1   9/2001  Mehlhorn et al.
6,343,172 B1*  1/2002  Schiestle et al. .............. 385/101
7,589,880 B2*  9/2009  Kempa et al. .................. 359/245
(Continued)

FOREIGN PATENT DOCUMENTS

CN      101778534 A       7/2012
JP         4831901 B2       9/2001
WO     2012129580 A2     10/2012

OTHER PUBLICATIONS

Atta et al., "Implementing Enhanced Optical Mirror Coupling and Alignment Utilizing Two-Photon Resist". Filed Jan. 11, 2012. U.S. Appl. No. 13/347,779.
(Continued)

*Primary Examiner* — Ellen Kim
(74) *Attorney, Agent, or Firm* — Robert R. Williams

(57) ABSTRACT

A method for fabricating a coaxial structure having an electrical conductor surrounded by an optically conductive dielectric is disclosed. The method may include creating an optical trench in an electrical conductor and depositing an optical material into the optical trench to cover an inner surface of the trench. The method may also include removing a portion of the deposited optical material from the optical trench to form an embedded trench in the deposited optical material, and building up electrically conductive material from within the embedded trench to create an inner electrical conductor. The method may also include depositing optical material around an exposed portion of the inner electrical conductor to create an optical channel encapsulating the inner electrical conductor, and depositing electrically conductive material over a top surface of the optical channel and over a top surface of the first electrical conductor to create the coaxial structure.

18 Claims, 4 Drawing Sheets

(51) Int. Cl.
*G02B 6/122* (2006.01)
*G02B 6/132* (2006.01)

(56) References Cited

U.S. PATENT DOCUMENTS

| | | | | |
|---|---|---|---|---|
| 8,249,402 | B2 * | 8/2012 | Asai et al. | 385/14 |
| 2011/0234421 | A1 * | 9/2011 | Smith | 340/854.3 |
| 2011/0286691 | A1 | 11/2011 | Hopkins et al. | |
| 2012/0008905 | A1 | 1/2012 | Han et al. | |
| 2012/0114340 | A1 | 5/2012 | Sugiyama | |

OTHER PUBLICATIONS

Doyle et al., "Implementing Embedded Hybrid Electrical-Optical PCB Construct". Filed Jan. 21, 2013. U.S. Appl. No. 13/745,982.
Immonen et al., "Development of Low-Cost Manufacturing Methods for Volume Production of Optical Printed Circuit Boards", Meadville. IBM Symposium, Nov. 18-19, 2009. 43 pages.

* cited by examiner

US 8,995,801 B2

PLANAR COAXIAL ELECTRICALLY AND OPTICALLY CONDUCTIVE STRUCTURE

TECHNICAL FIELD

The present disclosure relates to printed circuit boards. In particular, this disclosure relates to coaxial structures embedded within a printed circuit board.

BACKGROUND

A printed circuit board, or PCB, may be used to mechanically support and electrically connect electronic components using conductive paths or signal traces etched from copper sheets laminated onto non-conductive substrates. Multiple copper/insulator layer pairs (cores) may be laminated together in the fabrication of the PCB. Vertical interconnect structures (vias) are used to interconnect conductive signal traces between various conductive layers within the PCB.

The interconnect structures in the PCB are designed to be physically and electrically compatible with the components the PCB may be used to interconnect. The number and arrangement of cores may be designed to fit the needs of a variety of applications.

SUMMARY

Embodiments are directed towards a method for fabricating a coaxial structure having an electrical conductor surrounded by an optically conductive dielectric. The method may include creating an optical trench in a first electrical conductor and depositing an optical material into the optical trench to cover an inner surface of the trench. The method may also include removing a portion of the first deposited optical material from the optical trench to form an embedded trench in the deposited optical material, and building up electrically conductive material from within the embedded trench to create an inner electrical conductor.

The method may also include depositing optical material around an exposed portion of the inner electrical conductor to create an optical channel encapsulating the inner electrical conductor, and depositing electrically conductive material over a top surface of the optical channel and over a top surface of the first electrical conductor to create the coaxial structure.

Embodiments may also be directed towards a single electrically and optically conductive layer which may include an inner electrical conductor, an optical channel encapsulating the inner electrical conductor, and an outer electrical conductor further encapsulating the optical channel.

Embodiments may also be directed towards a wiring layer of a printed circuit board, which may include an inner electrical conductor, an optically opaque dielectric encapsulating the inner electrical conductor and an outer electrical conductor further encapsulating the optically opaque dielectric.

Aspects of the various embodiments may provide a means for electrical and/or optical signal transmission within a single layer of a printed circuit board. Aspects of the embodiments may also provide for high data bandwidths in small cross-sectional areas of printed circuit board material.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of embodiments of the disclosure and do not limit the invention.

In the drawings and the Detailed Description, like numbers generally refer to like components, parts, steps, and processes.

DETAILED DESCRIPTION

In general, various embodiments of the present disclosure relate to electrically and/or optically conductive coaxial channel structures that are designed to be fabricated within a single printed circuit board (PCB) layer, and thereby provide a thin, high bandwidth density interconnect layer. According to certain embodiments, a PCB constructed with a layer including the coaxial channel structures may be compliant with existing and proven PCB manufacturing processes and material sets. The coaxial channel structure layer may be particularly useful as a cost-effective way to add reliable, high-performance electrical and/or optical channels to PCB designs. A PCB constructed according to embodiments of the present disclosure may also be configured provide optical interconnect between optical devices, and coaxial electrical interconnect between electronic devices.

Certain embodiments of the present disclosure can be appreciated in the context of various PCB types, backplanes and laminate chip packages. Such PCBs may include backplanes used to mechanically support and optically interconnect optical devices, or PCBs used to provide integrated optical channels, and coaxial electrical channels between electronic devices. While not necessarily limited thereto, embodiments discussed in this context can facilitate an understanding of various aspects of the disclosure. Certain embodiments may also be directed towards other equipment and associated applications, such as a single layer containing coaxial structures, which may be used alone, or may be affixed to a planar surface other than PCB, such as a chassis member. Embodiments may also be directed towards a flexible or molded interconnect structure, light pipe structures, daughter or riser cards, or electrical coaxial conductor layers with optically opaque dielectric material.

Certain embodiments can be particularly useful by using aspects of known fabrication processes to create an electrically and optically conductive coaxial structure, which may facilitate low cost, reliable solutions not requiring substantial development time, effort or expense to implement.

For simplicity of illustration, certain figures show only a single coaxial structure, however, embodiments may include a plurality of coaxial structures, and a plurality of planar layers, each containing one or more coaxial structures.

While all figures illustrate the principles and features of the present disclosure, they are not necessarily drawn to scale.

Figure 1:
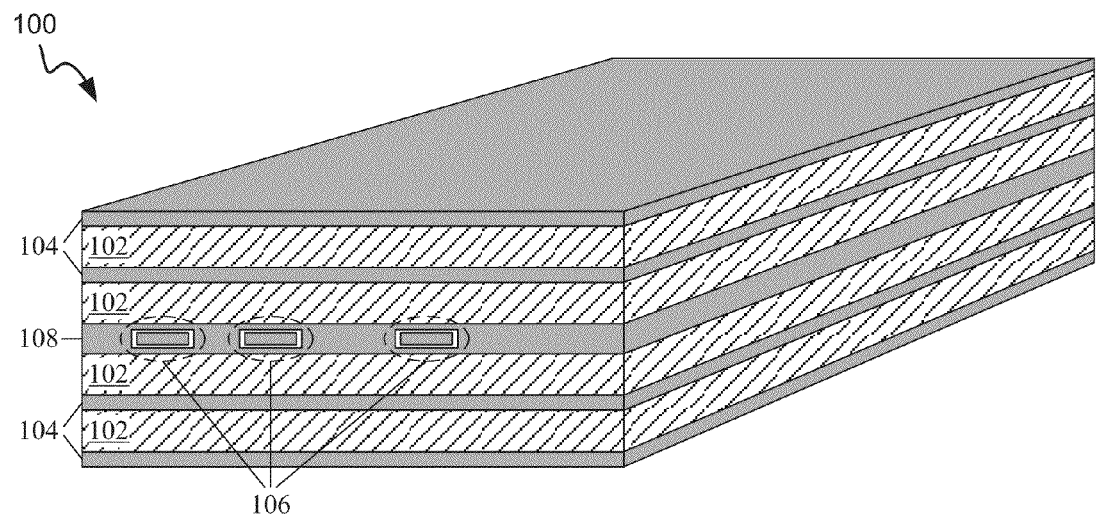
FIG. 1 is an isometric view of a printed circuit board including a conductor layer with coaxial structures, according to embodiments of the present disclosure.

FIG. 1 is an isometric view of a printed circuit board (PCB) 100 including a conductor layer 108 with coaxial structures 106, conductor layers 104 and dielectric layers 102 in a laminated planar arrangement, according to embodiments of the present disclosure. Conductor layer 108 includes coaxial structures 106, and has a substantially planar shape.

Coaxial structures 106 may include both shielded electrical conductors that enable electrical signal transmission, and optical channels that enable optical signal transmission along the coaxial structures 106. The arrangement of coaxial structures 106 within conductor layer 108 may be designed to meet the needs of a particular application.

The thickness and positioning of conductor layer 108 with coaxial structures 106 within the laminated structure of PCB 100 may be specified to allow suitable power and signal distribution characteristics of the PCB, and to enable robust electrical and optical channel performance of coaxial structures 106.

Conductor layer 108 with coaxial structures 106 and conductor layers 104 may have properties that facilitate compatibility with existing PCB material sets and manufacturing processes, thus promoting cost effective solutions. For example, the dimensions (width, length, and thickness) and substantially planar shape of conductor layers 104, 108 may be designed to be similar or identical. Conductor layers 104, 108 may also comprise compatible metals or other conductors (e.g., copper).

For simplicity of illustration only one conductor layer 108 with coaxial structures 106 is shown, however, more are possible in accordance with known manufacturing practices for PCBs.

The length, width, thickness, layer count and layer arrangement of printed circuit board 100 may be specified to suit a particular application. A certain layer configuration is depicted; however, other configurations are possible.

Multiple coaxial structures 106 may be used in a variety of combinations, individually or in groups to form electrical and/or optical interfaces. Groups of coaxial structures 106 may comprise coaxial structures 106 from one or more conductor layer 108 with coaxial structures 106 within a PCB. Groups of coaxial structures 106 may be used to form interfaces with desirable performance characteristics, for example, high aggregate bandwidths.

Conductor layer(s) 108 with coaxial structures 106 having pre-defined locations of coaxial structures 106 may be designed and manufactured, and used in fabricating PCBs having pre-defined, standardized locations of coaxial structures 106.

Figure 2:
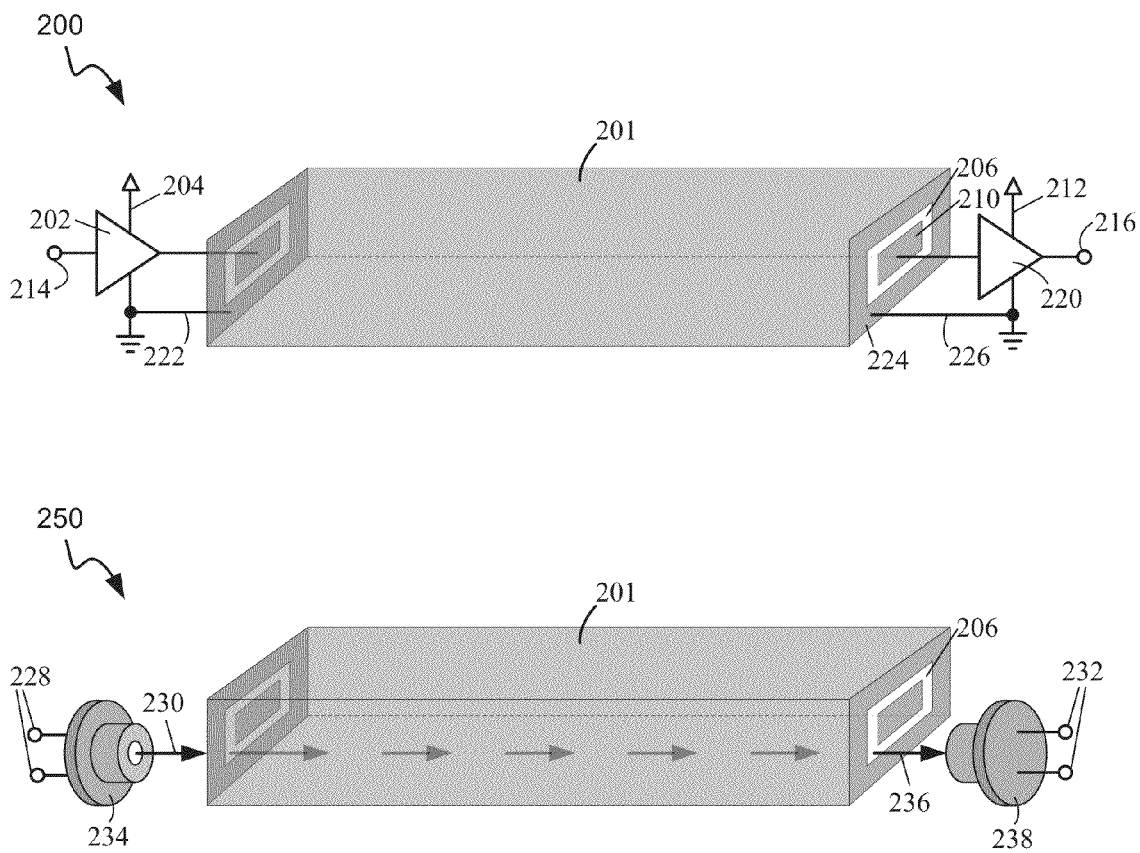
FIG. 2 includes two isometric views of coaxial structures including associated drivers and receivers, according to embodiments.

FIG. 2 includes two isometric views 200, 250 of coaxial structure 201 including associated drivers and receivers, according to embodiments of the present disclosure. Coaxial structure 201 comprises an inner electrical conductor 210 that is encapsulated in dielectric layer 206, which is further encapsulated in an electrical conductor 224, according to embodiments. While electrical conductor 224 is depicted having a rectangular cross-section, it can be constructed using a layer having a substantially planar shape (see 108, FIG. 1). Dielectric layer 206 may be optically transparent, and may function as both an optical channel and an electrical dielectric layer, according to certain embodiments. Dielectric layer 206 may be also be optically opaque, and function as an optically non-conductive electrical dielectric layer, according to certain embodiments.

For simplicity of illustration, the views 200, 250 depict the same coaxial structure 201, shown in view 200 as using an electrically conductive channel, and shown in view 250 as using an optically conductive channel, Embodiments may include aspects included in one or both of views 200, 250.

Various embodiments relate to channels with dielectric structures that are designed to be both optically and electrically conductive, and thereby provide a path for both optical and electrical signals to travel from one location to another within the conductor layer 108 with coaxial structures 106 (FIG. 1). According to certain embodiments, a coaxial structure that includes an optically conductive dielectric may facilitate optical communication between an optical driver at one location on the channel, and an optical receiver at another location. Certain embodiments can be appreciated in the context of PCBs providing optical communication paths between optical components, as well as coaxially shielded electrical channels.

While not necessarily limited thereto, embodiments discussed in this context can facilitate an understanding of various aspects of the disclosure. Certain embodiments can also be directed towards certain types of PCBs that may not require optical communications paths (that use only coaxial shielded electrical channels). Such embodiments may be particularly useful for providing high-performance, shielded electrical interconnect between two points in the PCB.

A designer may choose and specify the physical, electrical and optical properties of materials used in coaxial structure 201 to be suitable for a certain application. Overlapping and possibly conflicting design requirements for the electrically and optically conductive portions of coaxial structure 201 may necessitate design tradeoffs between aspects of various physical, electrical and optical material properties of coaxial structure 201.

The electrical characteristics of coaxial structure 201, for example, impedance, attenuation, and noise immunity, may be determined by the width and height of inner electrical conductor 210 and by the surrounding thickness, relative permittivity and loss tangent of dielectric layer 206. A designer may determine the coaxial structure 201 electrical characteristics by using electrical simulation software, and may specify appropriate dimensions and dielectric material types and/or properties to obtain the electrical characteristics suitable to a particular application.

The optical characteristics of coaxial structure 201, for example, optical attenuation and scattering, may be determined by the type of material used for, and the wavelength(s) of light transmitted through dielectric layer 206. A designer may choose a certain optical material for dielectric layer 206 based on its optical or other properties, such as mechanical stability, or ease of depositing or shaping during a manufacturing process.

For purposes of this discussion, the term "light" refers the portion of the electromagnetic spectrum that may be generally useful for optical data communications. It may be understood that this portion of the electromagnetic spectrum may extend beyond the range of light generally understood to be visible by the human eye (approximately 390 nm to 780 nm). Optical data transmission wavelengths may be in the infrared portion of the electro-magnetic spectrum.

Optical data transmission wavelengths may be chosen based on properties (e.g., scattering and reflection) of a certain optical media at certain wavelengths, or wavelength ranges. For example, wavelengths that may be useful for fiber optics may include, but are not limited to 650 nm, 850 nm, 1,300 nm, and 1,550 nm; these correspond to points or ranges in the electromagnetic spectrum that have minimal scattering and attenuation within the optical fiber. The properties of an optically conductive dielectric material may be chosen to be suitable for use with wavelengths of light generally useful for optical data communications. Wavelengths and associated optical materials may also be chosen based on frequency characteristics of commercially available optical data transmitters and receivers, such as lasers.

Certain embodiments may be particularly useful for transmission of data, particularly high speed serial data through one or both of the dielectric layer 206 or inner electrical conductor 210. Examples of serial data protocols may include, but are not limited to USB, PCI Express, FireWire, Ethernet and HyperTransport.

The shielded inner electrical conductor 210 may offer the electrical attributes of low signal loss, tightly controlled characteristic impedance and high noise immunity, and may be useful for the transmission of high speed serial (digital) data, or analog signals through inner electrical conductor 210.

Certain embodiments may employ inner electrical conductor 210 as both a source of DC power and a channel for transmitting signals by providing a DC offset to transmitted signals. The DC offset may be filtered, for example, using a low-pass filter, at a location where a power source may be needed for an electronic device, such as a transmitter or receiver. This type of arrangement may be useful in reducing the number of conductors needed to supply the signal and power needs of electrical or optical receivers at remote locations on a PCB, for example.

Embodiments may also use inner electrical conductor 210 as a source of DC power, with or without the transmission of any type of signals across it. Consistent with certain embodiments, electrical conductor 224 may be used as either a ground or a power plane, to provide a current path and/or shielding to electronic devices and signal interconnect of a PCB.

Certain embodiments may use both the inner electrical conductor 210 and the dielectric layer 206 in conjunction with each other to aggregate data transmission speeds or capabilities. Embodiments may also use the inner electrical conductor 210 and the dielectric layer 206 as separate data transmission channels.

In some embodiments, the optical dielectric material may be of various degrees of translucency, including opaque. In certain embodiments, an appropriate value of a dielectric material electrical property, for example, relative permittivity may not be available in an optically conductive dielectric material. In such cases, a non-optically conductive dielectric may be used to meet the electrical property needs of the dielectric material.

View 200 depicts an isometric view of a coaxial structure 201 connected to a driver 202, and a receiver 220, according to embodiments. Driver 202 may be connected to the left end of inner electrical conductor 210 of coaxial structure 201. Driver 202 may receive power from supply voltage 204, and may be connected to ground 222. Electrical conductor 224 of coaxial structure 201 can also be connected to ground. Driver input 214 is an input to driver 202.

Receiver 220 is connected to the right end of inner electrical conductor 210 of coaxial structure 201. Receiver 220 receives power from supply voltage 212, and may be connected to ground 226. Receiver output 216 is an output from receiver 220.

Driver 202 and receiver 220 may be designed to drive electronic signals into, and receive electronic signals from, the coaxial structure 201, respectively. Driver 202 may receive a signal on driver input 214 from an electronic device. The signal may then propagate through inner electrical conductor 210, and be received by receiver 220. Receiver 220 may then output a signal on receiver output 216, in response to the input received from the inner electrical conductor 210. The signal output on receiver output 216 may be connected to another electronic device.

View 250 depicts an isometric view of the coaxial structure 201 coupled with an optical transmitter 234, and an optical receiver 238, according to embodiments.

Optical transmitter 234 may be positioned at the left end of, and aligned with optically conductive dielectric layer 206 of coaxial structure 201, so that transmitted optical signal 230 can enter dielectric layer 206. Optical transmitter 234 may receive power and signals through optical transmitter inputs 228.

Optical receiver 238 may be positioned at the right end of, and aligned with optically conductive dielectric layer 206, so that received optical signal 236 can exit dielectric layer 206 and be received by optical receiver 238. Optical receiver outputs 232 are outputs from optical receiver 238.

Optical transmitter 234 and optical receiver 238 are designed to drive optical signals into, and receive optical signals from optically conductive dielectric layer 206 of the coaxial structure 201, respectively. Optical transmitter 234 may receive a signal on optical transmitter inputs 228 from an electronic device, and may output a transmitted optical signal 230. The transmitted optical signal 230 may then propagate through optically conductive dielectric layer 206, and be received by optical receiver 238, which may output a signal on receiver output 232, in response to the optical input received. The signal output on optical receiver outputs 232 may be connected to another electronic device.

Optical transmitters and receivers such as depicted by 234 and 238 may be discrete electronic devices, having a singular function of transmitting or receiving an optical signal, or they may be integrated into another electronic device such as an integrated circuit.

Dielectric layer 206 may be constructed from a variety of materials such as acrylics, polycarbonate, and a variety of other optically transparent polymers. The dimensions and optical properties of the optical material may be chosen to create an optical channel suitable to particular wavelength(s) of light transmitted across the optical channel.

An optical channel may provide higher bandwidth signals than electrical channel, depending on the properties of each interface, such a loss, reflection and noise immunity. For example, an electrically conductive channel for a certain application may have a bandwidth density of 28.5 Gbps/mm, while an optically conductive channel may have a bandwidth density of 160 Gbps/mm. High bandwidth density interconnect may be desirable in high-performance computing and other electronic applications, and may be enabled through the use of optical interconnect structures within a single PCB layer.

Figure 3:
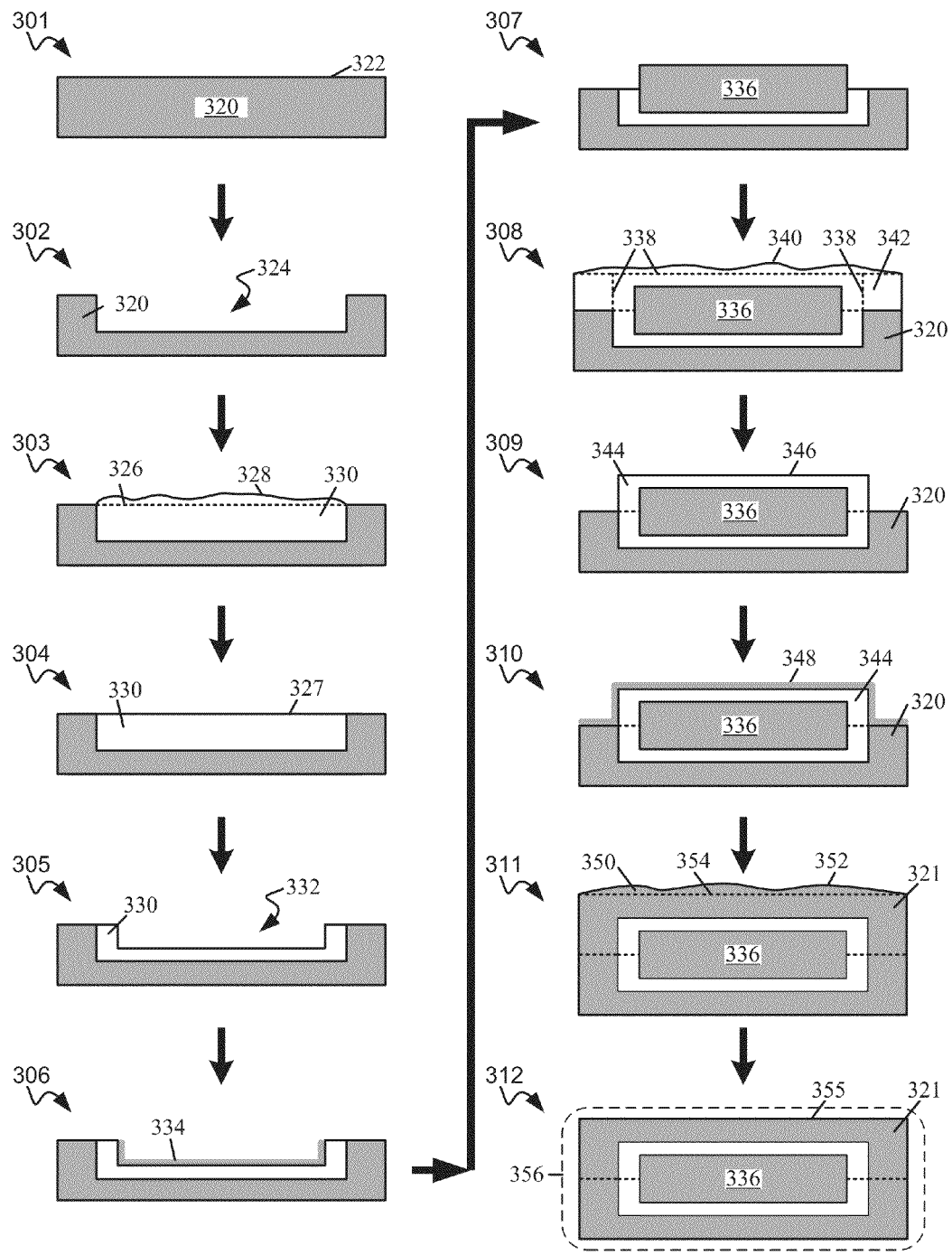
FIG. 3 includes twelve cross-sectional views illustrating the results of process steps for fabricating an electrically and optically conductive structure, according to embodiments.

FIG. 3 includes twelve cross-sectional views (301 through 312) illustrating the results of a sequential set of process steps for fabricating an electrically and optically conductive coaxial structure 356 (view 312), according to embodiments of the present disclosure. These views illustrate an example process; other views and steps may be possible.

The results of one or more process steps may be depicted in each view. For example, a view may depict the results of an etching process, which may also include photomask steps (apply, expose, develop, remove) that support the etching process.

Processing steps associated with views 301 through 312 may include, but are not limited to milling, laser ablation, electroplating (including electroless seed deposition) and acidic etching (including photomask steps).

The progression depicted in views 301 through 312 begins with a planar conductor material 320 (view 301) and ends with a completed coaxial structure 356 (view 312). For simplicity of illustration, completed structures are generally shown in the views as having rectangular cross-sectional profiles, with surfaces orthogonal to each other. This depiction, however, is not limiting; structures may be of any suitable shape, size and profile, in accordance with specific design criteria, lithographic and manufacturing process limitations and tolerances for a given application. For example, corners shown as having right angles may be rounded, surfaces may have a non-orthogonal relative orientation, and relative dimensional ratios may vary from those depicted in the figures.

View 301 depicts electrical conductor 320, having top surface 322. For simplicity of illustration, electrical conductor 320 is depicted having approximately the width of the completed coaxial structure 356 (view 312), however, electrical conductor 320 may represent a planar conductor material (e.g., copper) having a width significantly greater than depicted by the completed coaxial structure 356.

The width, length, and thickness of electrical conductor 320 may be specified to be compatible with dimensions of a PCB that includes the completed coaxial structure 356. The thickness of electrical conductor 320 may be chosen to accommodate specific dielectric material and inner conductor dimensions produced in subsequent steps.

Copper may be used for the first (outer) electrical conductor 320, due to its use in PCB fabrication. Other suitable conductor materials may also be used.

View 302 depicts the first electrical conductor 320 with an optical trench 324 created in its top surface 322. The optical trench 324 may be formed through an acidic etching process, which may involve applying a photomask to define optical trench boundaries, exposing and developing lines in the photoresist, etching one or more trenches in the electrical conductor 320, and stripping off the remaining photomask. The optical trench 324 may also be formed through a mechanical milling process. The width and depth of optical trench 324 may be specified to contain an amount of optical material suitable to a particular application.

View 303 depicts optical trench 324 filled with dielectric material 330, that covers both the bottom and side surfaces of optical trench 324, and which may prevent electrical contact between inner electrical conductor 336 (view 307) and electrical conductor 320. Dielectric material 330 may be deposited into optical trench 324 using one or more of a variety of processes, including but not limited to hot melt extrusion, insert molding and spin coating. Hot melt extrusion, for example, may involve forcing dielectric material under pressure through a nozzle into the optical trench 324, as the nozzle moves along the length of the optical trench 324. Optical material 330 may be in a liquid, gel, other viscous state while being deposited.

Types of dielectric material 330 may include but are not limited to be acrylics, polycarbonate, epoxy, PVC, or a variety of other optically transparent polymers. Dielectric materials may be of various degrees of translucency, including but not limited to completely transparent and opaque, and may be specified to have specific optical and/or electrical properties appropriate to a particular application.

The depositing process may leave an uneven top surface 328, which may have areas of material that rise above the top of electrical conductor 320. Leveling line 326 indicates a surface contour matching the top surface of electrical conductor 320.

View 304 depicts dielectric material 330 filling the optical trench 324, having uneven top surface 328 leveled to leveled surface 327, which correspond to leveling line 326. The top surface of dielectric material 330 may be leveled by a process such as milling, machining, laser ablation or polishing.

View 305 depicts leveled dielectric material 330 with an embedded trench 332 created in its top surface 327. The embedded trench 332 may be created in dielectric material 330 by removing some of the dielectric material 330 through a process of laser ablation. The embedded trench 332 may also be formed through a mechanical milling process. The embedded trench 332 is created as a location for creation of an inner electrical conductor 336 (view 307). The thickness of dielectric material 330 may be determined based on particular wavelength(s) of light being transmitted through it, or optical properties of the dielectric, such as scattering and reflection.

View 306 depicts embedded trench 332 having a conductive seed layer 334 such as electroless copper, lining its inner surfaces. The process may involve using applying a photomask to define locations for the seed layer, exposing and developing areas in the photoresist, deposit conductive seed layer and stripping off remaining photomask.

The process of seed layer deposition may include, but is not limited to electroless copper deposition, inkjet deposition of a conductive film, or vacuum processes such as PVD or sputtering. The seed layer may be used as a conductive base layer from which to continue building up an inner electrical conductor 336 through electroplating, or another process. As depicted, the conductive seed layer 334 is relatively thin compared to the thickness of the inner conductor layer 336 (view 307). An electroplating process may be particularly useful in building up metal structures such as inner electrical conductor 336 at a low cost.

View 307 depicts the inner conductor layer 336, built up on the conductive seed layer 334 from within embedded trench 332. The process for building up inner conductor layer 336 may include a copper electroplating process. Copper may be used for the inner electrical conductor 336, due to its suitability for use in PCB fabrication. Other suitable conductor materials may also be used.

View 308 depicts the exposed top and side surfaces of the inner conductor layer 336 and electrical conductor 320 covered with dielectric material 342, to encapsulate inner conductor layer 336, and to prevent electrical contact between inner electrical conductor 336 and electrical conductor 320. Dielectric material 342 may be deposited using one or more of a variety of processes, including but not limited to hot melt extrusion, insert molding and spin coating. Spin coating may be chosen as a method of application for dielectric material 342 over the inner conductor layer 336 and electrical conductor 320 due to its adaptability to planar surface coverage. The type of dielectric material 342 may be identical to or compatible with a type chosen with reference to view 303.

The depositing process may leave an uneven top surface 340, which may have areas of material that rise above the top of leveling lines 338. Leveling lines 338 indicate a specified top and side surface contour to provide a specified thickness of dielectric material 342 around inner electrical conductor 336. The depositing of optical material may involve a photomask process (previously described) to support placement of the material in the correct location to surround the inner electrical conductor 336.

View 309 depicts optical material 344 having been leveled and shaped according to a profile depicted by leveling lines 338. The top leveled surface 346 may be created by a milling, sanding polishing, laser ablation, or other subtractive process. Similarly, optical material on the sides of inner conductor 336 may be removed by milling or laser ablation. The shaping and/or removal of optical material may involve a photomask process (previously described).

View 310 depicts optical material 344 and electrical conductor 320 having a conductive seed layer 348 such as electroless copper, covering their exposed surfaces. The process may involve using a photomask to define locations for the seed layer. The deposition and photomask processes may be similar to those described in reference to view 306. As depicted, the conductive seed layer 348 is relatively thin compared to the thickness of electrical conductor layer 321 (view 311). Conductive seed layer 348 may be used as a conductive base layer from which to build up an electrical conductor layer 321 through electroplating, or another process.

View 311 depicts the electrical conductor 321 built up on top the conductive seed layer 348 from the exposed surfaces of optical material 344 and the top surface of electrical conductor 320. The process for building up electrical conductor 321 may include a copper electroplating process. Copper may be used for the electrical conductor 321, because it is often used in PCB fabrication. Other suitable conductor materials may also be used.

Electrical conductor 321 may have an uneven surface 352, which rises above a specified height of electrical conductor 321. Excess conductive material 350 may be any material which lies above the leveling line 354, which depicts the specified top surface of electrical conductor 321.

View 312 depicts electrically and optically conductive coaxial structure 356, with a top leveled surface 355, having been leveled according to a profile depicted by leveling line 354. The top leveled surface 355 may be created by a milling, sanding polishing, laser ablation, or other subtractive process. The process of leveling coaxial structure 356 may achieve a uniform specified thickness and flatness across the conductive coaxial structure 356, in accordance with PCB manufacturing tolerances and specifications.

Specified and actual finished dimensions of coaxial structures depicted in views 301 through 312 may be generally constrained by design needs, manufacturing and process tolerances, and availability of materials having certain dimensions.

Thicknesses of PCB structures may be specified in mils or ounces, where, for example, 1 oz. copper refers to the thickness of copper achieved by spreading 1 ounce of copper over an area of one square foot. Generally understood equivalences between ounces and mils are:

¼ oz.=0.35 mils
½ oz.=0.7 mils
1 oz.=1.4 mils
2 oz.=2.8 mils

These equivalences may vary depending on which stage in a particular PCB process they are associated with. For example, 1 oz. copper may refer to a thickness before or after an etching process, depending on the manufacturer's usage of the term.

The staring (before processing) thickness of electrical conductor 320 (view 301) may be 1 oz thick for a certain application, but for other applications it may be 2 oz. or ½ oz. thick. The thickness of electrical conductor 320 (view 301) may be constrained by acidic etching process capabilities and tolerances, as used to create an optical trench in electrical conductor 320 (view 301). The thickness of the bottom of optical trench 324 (view 302) may be ¼ oz after the acidic etching process. Similarly, the thickness of electrical conductor 321 (view 312) may be ¼ oz after the leveling process.

The width of the optical channels 330 (view 303) may be as small as 13 mils in certain applications, and the optical material width around the sides of the inner electrical conductor 336 may be as small as 2.5 mils in certain applications, but may be wider, based on application requirements. An optical material thickness above and below inner electrical conductor 336 may be as small as 2 mils in certain applications.

The inner electrical conductor 336 (view 307) may have a width as small as 8 mils, but may be wider based on application requirements. The inner electrical conductor 336 (view 307) final height of ½ oz, and a finished width in the range of 20 to 180 mils. The optical channel 330 (view 303) may have a finished width between 60 to 240 mils.

The total coaxial structure 356 (view 312) may have a finished height of 2 oz., and may be equivalent to the thickness of copper conductor layers used in existing PCB processes, such as ½ oz. , 1 oz., or 2 oz.

Figure 4:
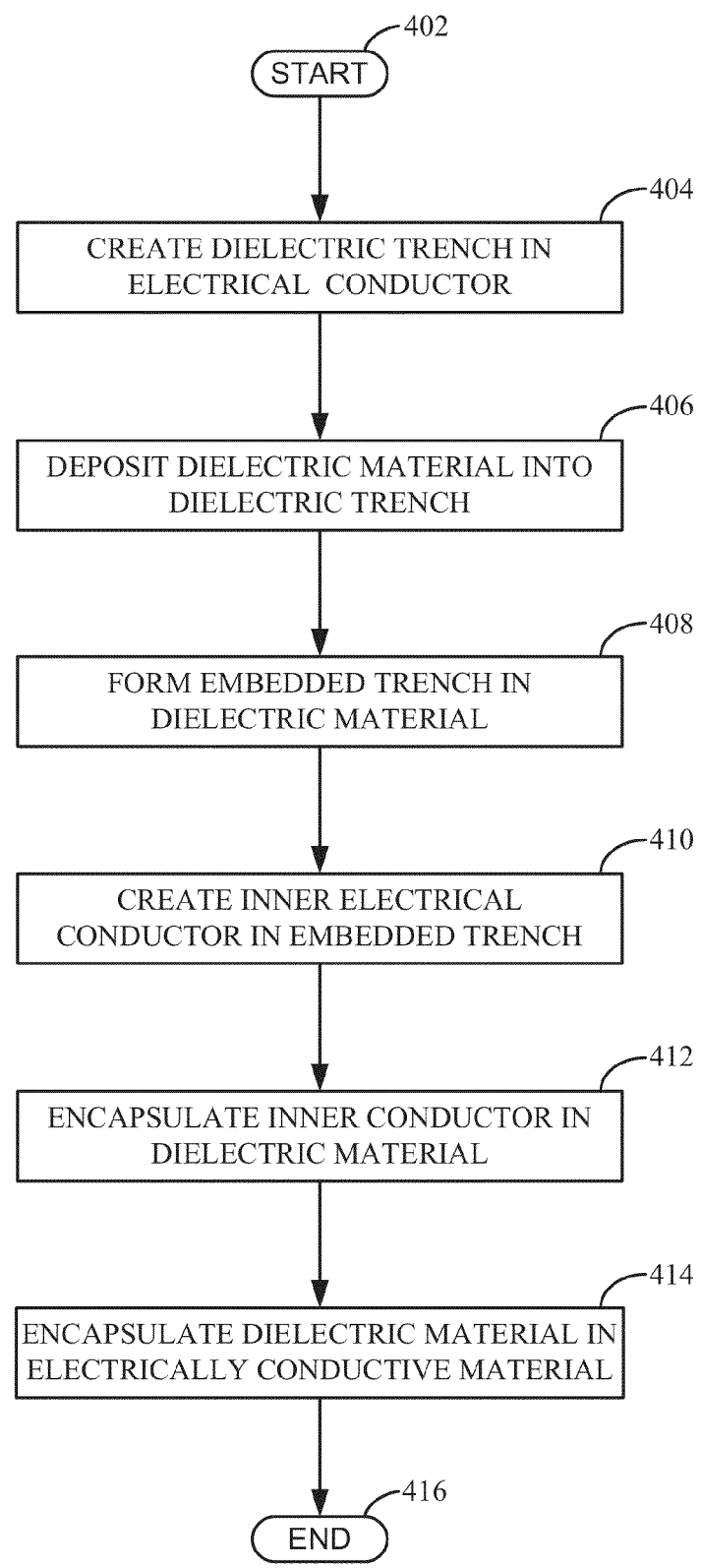
FIG. 4 is a flow diagram illustrating steps for fabricating an electrically and optically conductive structure, according to embodiments.

FIG. 4 is a flow diagram illustrating steps for fabricating an electrically and optically conductive structure, according to embodiments.

The process 400 moves from start 402 to operation 404. Operation 404 generally refers to the process steps that involve creating a dielectric trench in an electrical conductor, which may correspond to the views provided by 301, 302 (FIG. 3) and their associated descriptions. Once a dielectric trench has been created in an electrical conductor, the process moves to operation 406.

Operation 406 generally refers to the process steps that involve depositing and leveling dielectric material in the dielectric trench, which may correspond to the views provided by 303, 304 (FIG. 3) and their associated descriptions. Once dielectric material has been deposited and leveled in the dielectric trench, the process moves to operation 408.

Operation 408 generally refers to the process steps that involve forming an embedded trench in the dielectric material, which may correspond to the view provided by 305 (FIG. 3) and its associated description. After an embedded trench is formed in the dielectric material, the process moves to operation 410.

Operation 410 generally refers to the process steps that involve creating an inner electrical conductor in the embedded trench, which may correspond to the views provided by 306, 307 (FIG. 3) and their associated descriptions. After an inner electrical conductor is created in the embedded trench, the process moves to operation 412.

Operation 412 generally refers to the process steps that involve encapsulating the inner conductor in dielectric material, which may correspond to the views provided by 308, 309 (FIG. 3) and their associated descriptions. After the inner conductor is encapsulated in dielectric material, the process moves to operation 414.

Operation 414 generally refers to the process steps that involve encapsulating the dielectric material in an electrically conductive material, which may correspond to the views provided by 310, 311, 312 (FIG. 3) and their associated descriptions. After the dielectric material is encapsulated in an electrically conductive material, the process 400 may end at block 416.

Although the present invention has been described in terms of specific embodiments, it is anticipated that alterations and modifications thereof may become apparent to those skilled in the art. Therefore, it is intended that the following claims be interpreted as covering all such alterations and modifications as fall within the true spirit and scope of the invention.

What is claimed is:
1. A method for fabricating a coaxial structure having an inner electrical conductor surrounded by an optically conductive dielectric, comprising:
  creating an optical trench in a first electrical conductor;
  making a first deposit of an optical material into the optical trench to cover an inner surface of the trench;

removing a portion of the first deposit of the optical material from the optical trench to form an embedded trench in the first deposit of the optical material;

building up electrically conductive material from within the embedded trench to create the inner electrical conductor;

making a second deposit of the optical material around an exposed portion of the inner electrical conductor to create an optical channel encapsulating the inner electrical conductor; and depositing electrically conductive material over a top surface of the optical channel and over a top surface of the first electrical conductor to create the coaxial structure.

2. The method of claim 1, wherein the coaxial structure has a cross-sectional shape that is rectangular.

3. The method of claim 2, wherein a first layer of a printed circuit board comprises the coaxial structure.

4. The method of claim 3, further comprising laminating the first layer of the printed circuit board with a second layer of a printed circuit board.

5. The method of claim 1, wherein at least one of the inner electrical conductor and the first electrical conductor is comprised of copper.

6. The method of claim 1, wherein creating the optical trench further includes the use of an etching process.

7. The method of claim 1, wherein the making of at least one of the first and the second deposits of the optical material further includes the use of one of a hot melt extrusion process, an insert molding process and a spin coating process to deposit the optical material.

8. The method of claim 1, wherein the making of at least one of the first and second deposits of the optical material further includes the use of a process to level a surface of the deposit of optical material.

9. The method of claim 1, wherein removing a portion of at least one of the first and the second deposits of optical material comprises laser ablation.

10. The method of claim 1, wherein building up electrically conductive material comprises depositing a conductive seed layer.

11. The method of claim 10, wherein building up electrically conductive material further comprises employing a copper electroplating process.

12. The method of claim 11, wherein building up electrically conductive material further comprises employing a process that includes photomasks and photoresist to select areas in which to build up electrically conductive material.

13. The method of claim 1, wherein depositing electrically conductive material over a top surface of the optical channel and over a top surface of the first electrical conductor further comprises leveling a top surface of the deposited electrically conductive material to achieve a uniform thickness of the coaxial structure.

14. A printed circuit board comprising:
a layer of the printed circuit board laminated with another layer of the printed circuit board and having an electrically and optically conductive coaxial structure;
the electrically and optically conductive coaxial structure having:
an inner electrical conductor;
an optical channel encapsulating the inner electrical conductor, the optical channel being formed of a dielectric material; and
an outer electrical conductor further encapsulating the optical channel.

15. The printed circuit board of claim of claim 14, further including an electrical signal transmitter that is connected to a proximal end of the inner electrical conductor, and an electrical signal receiver that is connected to a distal end of the inner electrical conductor.

16. The printed circuit board of claim 15, wherein an electrical signal transmitter is configured to supply a DC voltage on the inner electrical conductor.

17. The printed circuit board of claim 14, further including an optical signal transmitter that is connected to a proximal end of the optical channel, and an optical signal receiver is connected to a distal end of the optical channel.

18. A printed circuit board comprising:
a layer of a printed circuit board having an electrically conductive coaxial structure;
the electrically conductive coaxial structure having:
an inner electrical conductor;
a dielectric encapsulating the inner electrical conductor, the dielectric being formed of an optically opaque material; and
an outer electrical conductor further encapsulating the dielectric; and
an electrical signal transmitter that is connected to a proximal end of the inner electrical conductor, and an electrical signal receiver that is connected to a distal end of the inner electrical conductor.

* * * * *